(12) United States Patent
Prakash et al.

(10) Patent No.: US 12,401,331 B2
(45) Date of Patent: Aug. 26, 2025

(54) DRIVER CIRCUITRY

(71) Applicant: Cirrus Logic International Semiconductor Ltd., Edinburgh (GB)

(72) Inventors: Chandra B. Prakash, Austin, TX (US); Tejasvi Das, Austin, TX (US); Cory J. Peterson, Austin, TX (US); Siddharth Maru, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 639 days.

(21) Appl. No.: 17/729,626

(22) Filed: Apr. 26, 2022

(65) Prior Publication Data

US 2023/0146592 A1 May 11, 2023

Related U.S. Application Data

(60) Provisional application No. 63/276,766, filed on Nov. 8, 2021.

(51) Int. Cl.
*H03F 3/217* (2006.01)
*H03F 3/213* (2006.01)
*H03M 1/12* (2006.01)

(52) U.S. Cl.
CPC ........... *H03F 3/2173* (2013.01); *H03F 3/213* (2013.01); *H03F 2200/03* (2013.01); *H03M 1/12* (2013.01)

(58) Field of Classification Search
CPC .... H03F 3/2173; H03F 3/213; H03F 2200/03; H03F 2203/45528; H03F 3/187; H03F 3/45475; H03F 3/2171; H03M 1/12

USPC ......................................................... 330/108
See application file for complete search history.

(56) References Cited

U.S. PATENT DOCUMENTS

| 2009/0003628 A1* | 1/2009 | Kirn | H04R 3/007 381/121 |
|---|---|---|---|
| 2019/0028805 A1 | 1/2019 | Goto | |
| 2020/0186927 A1 | 6/2020 | Lesso et al. | |

OTHER PUBLICATIONS

International Search Report and Written Opinion of the International Searching Authority, International Application No. PCT/GB2022/052394, mailed Dec. 9, 2022.

* cited by examiner

*Primary Examiner* — Andrea Lindgren Baltzell
*Assistant Examiner* — Khiem D Nguyen
(74) *Attorney, Agent, or Firm* — Jackson Walker L.L.P.

(57) ABSTRACT

Circuitry for driving a load, the circuitry comprising: driver circuitry; and load sensing circuitry, wherein the circuitry is operable in: a driving mode of operation in which the driver circuitry supplies a drive signal to a load coupled to the circuitry; and a load sensing mode of operation, for estimating a characteristic of a load coupled to the circuitry based on a signal output by the load sensing circuitry in response to a stimulus signal, wherein the circuitry is configured to, in response to a request for operation of the circuitry in the load sensing mode: compare an indication of a current through the load to a predefined threshold; and if the indication of the current through the load meets the predefined threshold, prevent or delay operation in the load sensing mode.

19 Claims, 3 Drawing Sheets

DRIVER CIRCUITRY

FIELD OF THE INVENTION

The present disclosure relates to driver circuitry for driving a load, and in particular to integrated circuitry implementing such driver circuitry.

BACKGROUND

Driver circuitry for driving a load such as an audio transducer (e.g. a speaker) or a haptic transducer (e.g. an actuator such as a linear resonant actuator) often includes auxiliary sense circuitry for sensing or monitoring of the load. For example, driver circuitry may include voltage detection (VMON) and current detection (IMON) circuit blocks, for detecting, respectively, a voltage across the load and a current through the load while the transducer is being driven by a playback signal such as an audio signal or a haptic waveform. In this context, a playback signal is a drive signal that drives the transducer to generate a desired output such as an audio or haptic output.

The detected voltage and current can be used to calculate, measure, estimate or otherwise determine an impedance of the transducer, which may be a complex impedance having resistive, inductive and/or capacitive components. Determining the complex impedance may involve measuring, estimating or otherwise determining a real (resistive) part and an imaginary (inductive) part of the complex impedance separately. The determined impedance may be used in applications such as speaker protection while the playback signal is being provided to the transducer, or to estimate a position of a moving mass of an actuator.

SUMMARY

According to a first aspect, the invention provides circuitry for driving a load, the circuitry comprising:
  driver circuitry; and
  load sensing circuitry,
  wherein the circuitry is operable in:
    a driving mode of operation in which the driver circuitry supplies a drive signal to a load coupled to the circuitry; and
    a load sensing mode of operation, for estimating a characteristic of a load coupled to the circuitry based on a signal output by the load sensing circuitry in response to a stimulus signal,
  wherein the circuitry is configured to, in response to a request for operation of the circuitry in the load sensing mode:
    compare an indication of a current through the load to a predefined threshold; and
    if the indication of the current through the load meets the predefined threshold, prevent or delay operation in the load sensing mode.

The circuitry may be configured to commence operation in the load sensing mode when the indication of the current through the load falls below the predefined threshold.

The circuitry may further comprise control circuitry operable to apply a stimulus to the circuitry to reduce the current through the load if the indication of the current through the load meets the predefined threshold.

The circuitry may further comprise:
  a first load terminal coupled to an output of the driver circuitry; and
  a second load terminal coupled to a return path,
  wherein in use of the circuitry the load is coupled between the first load terminal and the second load terminal,
  wherein the return path comprises a return path switch for coupling the second load terminal to a reference voltage supply,
  and wherein the stimulus comprises a control signal supplied to a control terminal of the return path switch to control an impedance of the return path switch.

The control signal may be for:
  setting the return path switch to a low impedance state;
  setting an impedance of the return path switch to a particular value; or
  adjusting the impedance of the return path switch over time.

The circuitry may further comprise a load discharge path comprising a load discharge switch for selectively coupling the load to ground, and the stimulus may comprise a control signal supplied to a control terminal of the load discharge switch.

The load discharge path may further comprise a resistor in series with the load discharge switch.

The driver circuitry may comprise a half-bridge output stage for supplying the drive signal to the load. The stimulus may comprise a control signal supplied to a control terminal of a low-side switch of the half-bridge output stage to control an impedance of the low-side switch.

The control signal may be for:
  setting the low-side switch to a low impedance state;
  setting an impedance of the low-side switch to a particular value; or
  adjusting the impedance of the low-side switch over time.

The driver circuitry may comprise a half-bridge output stage for supplying the drive signal to the load. The stimulus may comprise a control signal supplied to a control terminal of a high-side switch of the half-bridge output stage to switch the high-side switch on.

The driver circuitry may comprise Class D amplifier circuitry.

The stimulus may comprise a voltage supplied to the load by a low-impedance voltage source.

The circuitry may comprise current monitoring circuitry operable to monitor a current through the load in operation of the circuitry in the driving mode. The indication of a current through the load may comprise an output of the current monitoring circuitry.

The indication of the current through the load may comprise a sample of a signal output by the current monitoring circuitry, the sample taken in response to the request for operation of the circuitry in the load sensing mode.

The driver circuitry may be configured to supply the stimulus signal in operation of the circuitry in the load sensing mode.

The circuitry may further comprise dedicated load sense driver circuitry configured to supply the stimulus signal in operation of the circuitry in the load sensing mode.

According to a second aspect, the invention provides integrated circuit comprising circuitry according to the first aspect.

According to a third aspect, the invention provides a host device comprising circuitry according to the first aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which.

DETAILED DESCRIPTION

Figure 1:
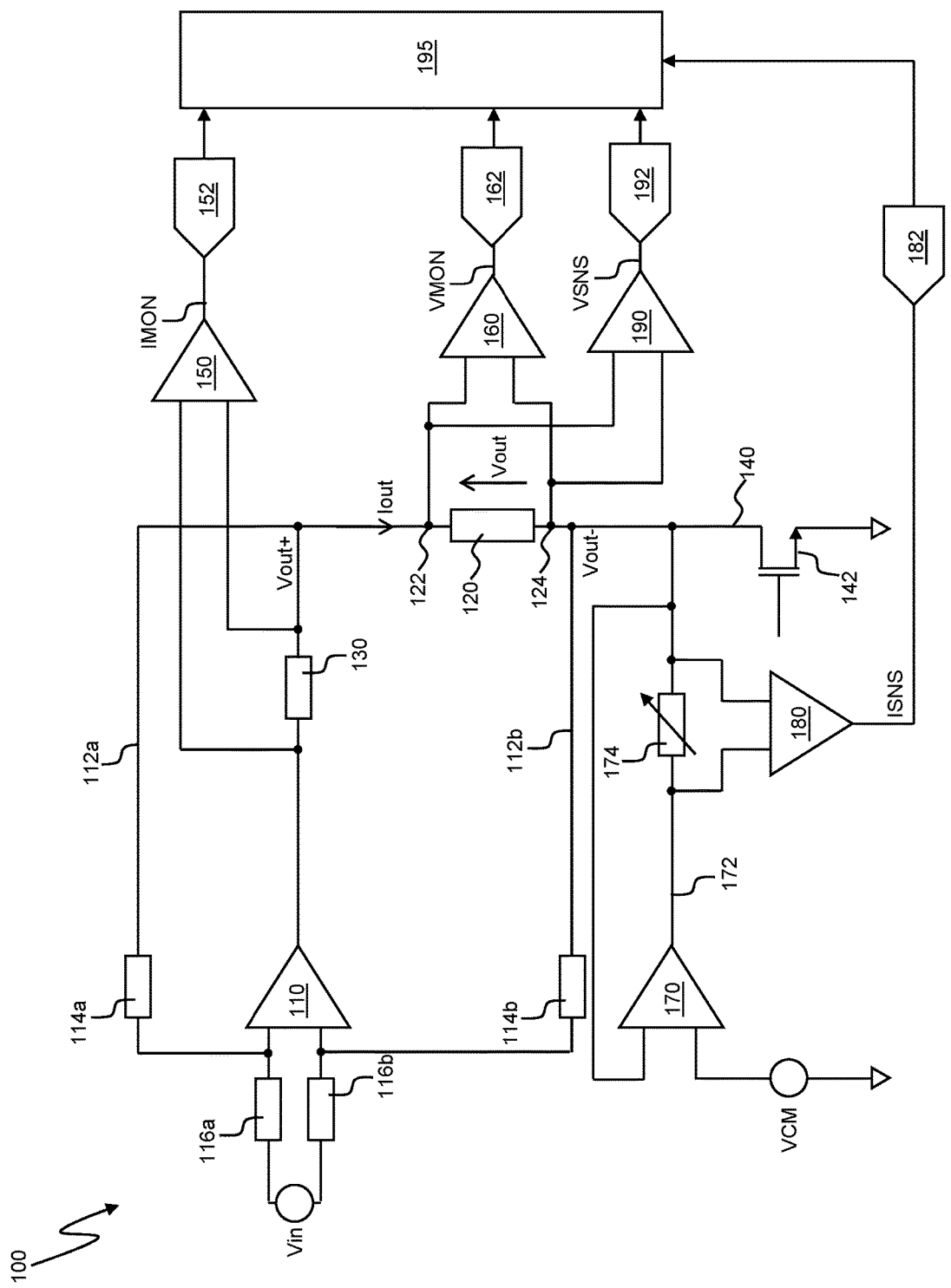
FIG. 1 is a schematic diagram showing an example of circuitry that includes load sensing circuitry.

FIG. 1 is a schematic diagram showing an example of circuitry that includes load sensing circuitry comprising voltage and current monitoring paths for monitoring, respectively, a voltage across a load and a current through the load during operation of the circuitry to drive the load.

The circuitry, which may be implemented as an integrated circuit (IC), is shown generally at 100 in FIG. 1. The circuitry 100 includes driver circuitry 110 configured to receive an input signal and to output a drive signal for driving a load 120, which is external to the circuitry (e.g. the load is provided off-chip, in examples in which the circuitry 100 is implemented as an IC). The load 120 may be an inductive load such as an audio transducer (e.g., a speaker), or a haptics transducer or actuator (e.g., a linear resonant actuator).

The driver circuitry 110 in the illustrated example comprises differential amplifier circuitry and may be implemented, for example, as Class A, Class AB or Class D amplifier circuitry. An output of the driver circuitry 110 is coupled, via a current sense resistor 130, to a first load terminal 122. A second load terminal 124 is coupled, via a return path 140 comprising a return path switch 142 which may be, for example, a N-channel MOSFET device, to ground (or some other reference voltage supply). In use of the circuitry 100, a first terminal of the external load 120 is coupled to the first load terminal 122, and a second terminal of the external load 120 is coupled to the second load terminal 124. Thus, in use of the circuitry 100 the external load 120 is coupled in series between the current sense resistor 130 and ground (or some other reference voltage supply).

A first feedback path 112a comprising a first feedback resistor 114a is provided between the first load terminal 122 and a first input of the driver circuitry 110. A second feedback path 112b comprising a second feedback resistor 114b is provided between the second load terminal 124 and a second input of the driver circuitry 110. First and second input resistors 116a, 116b are coupled to the first and second inputs, respectively, of the driver circuitry 110. A differential input signal pair Vin is supplied to the first and second inputs of the driver circuitry 110 via the first and second input resistors 116a, 116b.

Inputs of a current monitor amplifier 150 are coupled to first and second terminals of the current sense resistor 130, such that in use of the circuitry 100 in a driving or playback mode of operation the current monitor amplifier 150 generates a signal (e.g. a voltage) IMON at its output that is indicative of a current through the load 120.

Inputs of a voltage monitor amplifier 160 are coupled to the first and second load terminals 122, 124 of the circuitry, such that in use of the circuitry 100 in the driving or playback mode of operation the voltage monitor amplifier 160 generates a signal (e.g. a voltage) VMON at its output that is indicative of a voltage across the load 120.

The circuitry further includes common mode buffer circuitry 170, which is configured to output a common mode voltage VCM to the return path 140 during operation of the circuitry 100 in a load sensing mode of operation. An output of the common mode buffer circuitry 170 is thus coupled to the return path 140 by a common mode signal path 172 that includes a variable current sense resistor 174. The variable current sense resistor 174 is thus coupled in series with the external load 120, in use of the circuitry 100 in the load sensing mode of operation.

Inputs of a current sense amplifier 180 are coupled to first and second terminals of the variable current sense resistor 174, such that in use of the circuitry 100 in the load sensing mode the current sense amplifier 180 generates a signal (e.g. a voltage) ISNS indicative of a current through the external load 120.

Inputs of a voltage sense amplifier 190 are coupled to the first and second load terminals 122, 124, such that in use of the circuitry 100 in the load sensing mode the voltage sense amplifier 190 generates a signal (e.g. a voltage) VSNS indicative of a voltage across the external load.

In operation of the circuitry 100 in the driving or playback mode of operation, the return path switch 142 is closed, thus coupling the output of the driver circuitry 110 to ground (or some other reference voltage) via the current sense resistor 130 and the external load 120. The common mode buffer circuitry 170 is switched off or otherwise disabled.

Thus, a voltage Vout− at the second load terminal 124 is equal to 0 v (assuming that the reference voltage is ground). A driving waveform is supplied to the driver circuitry 110, which in turn outputs a drive signal to the load 120.

The voltage monitor amplifier 160 generates a signal (e.g. a voltage) VMON indicative of the voltage that develops across the load 120 as a result of the drive signal supplied to the load 120 by the driver circuitry 110, and the current monitor amplifier 150 generates a signal (e.g. a voltage) IMON indicative of the current through the load 120 as a result of the drive signal.

The VMON and IMON signals may be digitised by suitable analog to digital converter (ADC) circuitry 162, 152, and the VMON and IMON signals (or their digital versions) can be used by downstream processing circuitry 195 to calculate, estimate or otherwise determine the complex impedance of the load 120 for the drive signal that has been supplied to it by the driver circuitry 110. The complex impedance so determined may be used, for example, to estimate an excursion of the load (e.g. where the load 120 is an audio transducer such as a speaker), or to estimate a position of a moving mass of the load 120 (e.g. where the load is an actuator such as a linear resonant actuator).

In operation of the circuitry 100 in a load sensing mode of operation, the return path switch 142 is opened, thus decoupling the load 120 from the ground or other reference voltage. The common mode buffer circuitry 170 is switched on, to supply the common mode voltage VCM to the second load terminal 124.

Thus, a voltage Vout− at the second load terminal 124 is equal to VCM. A stimulus waveform of a known frequency or frequency range fsns and a known amplitude is supplied to the driver circuitry 110, which in turn supplies a stimulus signal to the load 120. Alternatively, the circuitry 100 may include dedicated load sense driver circuitry configured to supply the stimulus waveform to the load 120 in operation of the circuitry 100 in the load sensing mode.

The voltage sense amplifier 190 generates a signal (e.g. a voltage) VSNS indicative of the voltage that develops across the load 120 as a result of the stimulus signal supplied to the load 120 by the driver circuitry 110 (or by the dedicated load sense driver circuitry), and the current sense amplifier 180 generates a signal (e.g. a voltage) ISNS indicative of the current through the load 120 as a result of the stimulus signal.

The VSNS and ISNS signals may be digitised by suitable analog to digital converter (ADC) circuitry 192, 182, and the VSNS and ISNS signals (or their digital versions) can be used by the downstream processing circuitry 195 to calculate, estimate or otherwise determine the complex impedance of the load 120 at the frequency or frequency range fsns. To facilitate accurate determination of the impedance of the load 120, the VSNS and ISNS signal paths (i.e. the voltage sense amplifier 190 and the associated ADC circuitry 192 and the current sense amplifier 180 and the associated ADC circuitry 182) may have identical gain and phase profiles, to avoid any gain or phase mismatch between the VSNS and ISNS signals that could introduce error into the real part or the imaginary part of the determined load impedance.

In operation of the circuitry 100 in the load sensing mode of operation, a voltage Vout across the load 120 and a current Iout through the load are both fixed when the stimulus signal of frequency fsns is supplied, to avoid any noticeable change in the load impedance during a load impedance sensing operation.

The voltage Vout is preferably maximised for a particular load 120 to maximise the current through the load 120, so as to maximise or at least increase a signal to noise ratio (SNR) of signal paths to the downstream processing circuitry for both the VSNS signal and the ISNS signal.

Similarly, the resistance of the variable current sense resistor 174 and the gain of the signal paths for the VSNS and ISNS signals are preferably maximised to maximise or at least increase the SNR VSNS and ISNS signals.

In operation of the circuitry 100 in the driving or playback mode of operation there can be a very large current flowing through the inductive load 120. Due to the inductive nature of the load 120, this load current can take time to decay to zero after the driver circuitry 110 has stopped supplying the driving waveform.

If the circuitry 100 transitions from the driving or playback mode of operation to the load sensing mode of operation while there is still residual current flowing through the load (i.e. before the load current arising due to the driving waveform has decayed to zero), the signal ISNS indicative of the current through the load 120 will include a component arising from this residual current and may saturate the downstream processing circuitry 195, and will thus not be an accurate representation of the current through the load 120 as a result of the stimulus signal supplied during the load sensing mode. Any calculation or estimation of the impedance of the load 120 based on the ISNS signal will thus be inaccurate.

Thus a desire exists for a way to improve the accuracy of an estimate of the impedance of the load 120.

One approach to improving the accuracy of the estimate of the load impedance is to implement a delay of a predetermined duration after switching from the driving or playback mode to the load sensing mode of operation before performing the operation(s) required to determine or estimate the impedance of the load 120.

For example, in response to a request from a host device incorporating the circuitry 100 (e.g. a request received from an applications processor of the host device), the circuitry 100 may switch from the driving or playback mode to the load sensing mode. However, the downstream processing circuitry 195 may wait for the predetermined duration before performing the operations required to determine or estimate the load impedance. This delay permits the residual current through the load to decay to zero (or some other level at which the error in the VSNS and/or ISNS signals is tolerable), thus minimising or at least reducing the effect of the residual load current on the accuracy of the determined load impedance.

As will be appreciated, to be effective for a range of different loads with different inductances, the predetermined duration may need to be relatively long, e.g. greater than 1 ms, which may be undesirably long for low latency load sensing applications.

In an alternative approach according to the present disclosure, the current through the load 120 is monitored by the current monitor path comprising the current monitor amplifier 150 and the associated ADC 152, and a requested transition to operation in the load sensing mode is prevented or delayed if the load current meets (i.e. is equal to or greater than) a predefined threshold.

Figure 2:
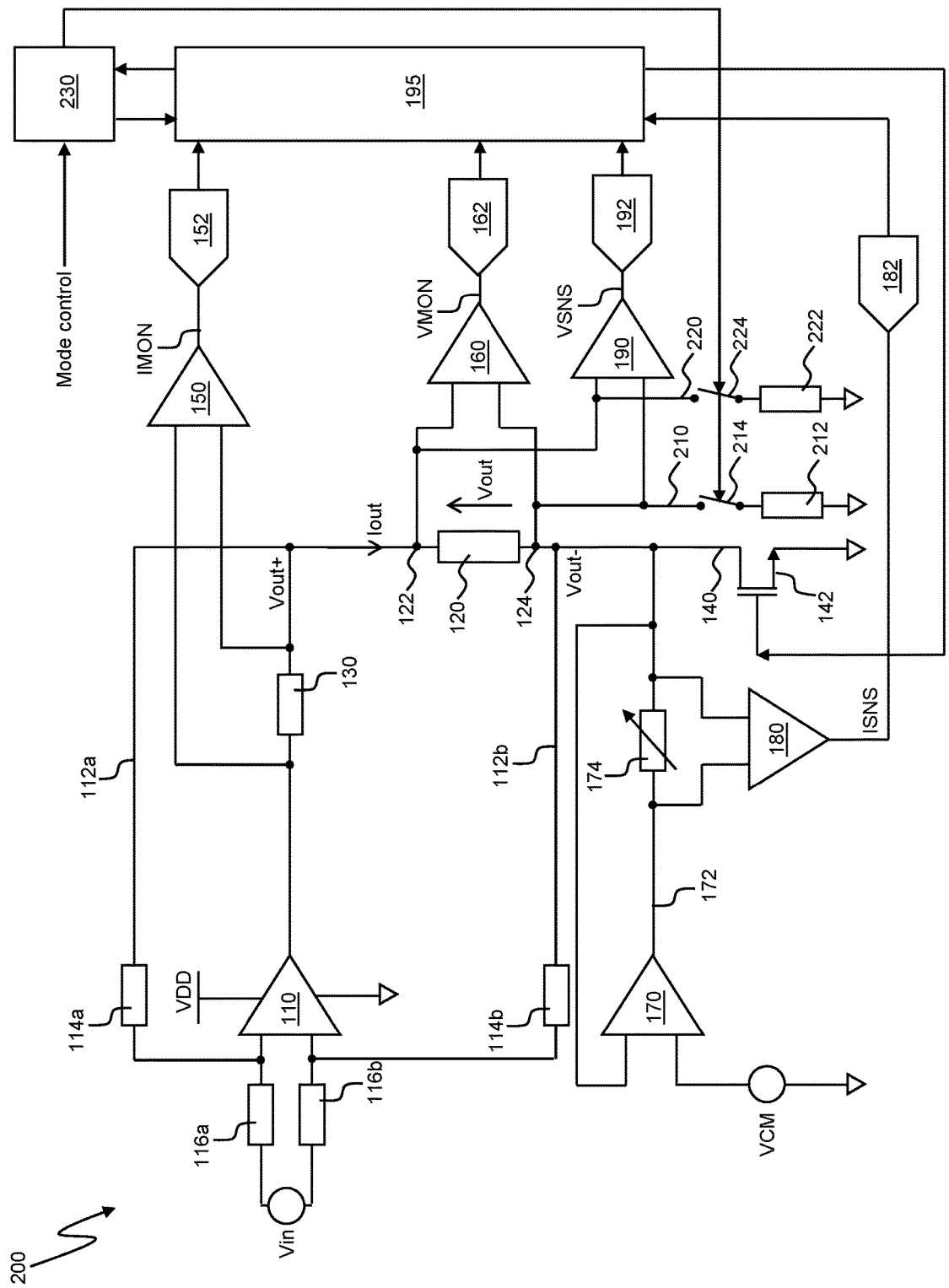
FIG. 2 is a schematic representation of an example of circuitry according to the present disclosure.

FIG. 2 is a schematic diagram showing a further example of circuitry that includes load sensing circuitry comprising voltage and current monitoring paths for monitoring, respectively, a voltage across a load and a current through the load during operation of the circuitry to drive the load.

The circuitry 200 of FIG. 2 includes a number of elements in common with the circuitry 100 of FIG. 1. Such common elements are denoted by common reference numerals in FIGS. 1 and 2 and will not be described in detail here.

In addition to the elements in common with the circuitry 100 of FIG. 1, the circuitry 200 of FIG. 2 also includes first and second load discharge paths 210, 220 (though in some examples the second load discharge path 220 may be omitted) and control circuitry 230.

A first end of the first load discharge path 210 is coupled to the second load terminal 124. A second end of the first load discharge path 210 is coupled to ground. The first load discharge path 210 in this example includes a first discharge resistor 212 and a first discharge switch 214, but it will be appreciated that in other examples the first discharge resistor 212 could be omitted, such that the first load discharge path 210 includes only the first discharge switch 214, coupled between the second load terminal 124 and ground.

Similarly, a first end of the second load discharge path 220 is coupled to the first load terminal 122. A second end of the second load discharge path 220 is coupled to ground (or some other reference voltage supply). The second load discharge path 220 in this example includes a second discharge resistor 222 and a second discharge switch 224, but it will be appreciated that in other examples the second discharge resistor 222 could be omitted, such that the second load discharge path 220 includes only the second discharge switch 224, coupled between the first load terminal 122 and ground (or some other reference voltage supply).

The circuitry 200 is operable in a driving or playback mode and a load sensing mode, under the control of the control circuitry 230. The control circuitry 230 is configured to control the operation of the circuitry 200 in accordance with a mode control signal that may be provided, for example, by an applications processor of a host device such as a mobile telephone or the like that incorporates the circuitry 200. The control circuitry 230 is thus configured to control the mode of operation of the circuitry 200, and to control when operation of the circuitry 200 in the driving or playback mode and in the load sensing mode starts and ends.

In the driving or playback mode, the return path switch 142 is closed and the common mode buffer circuitry 170 is switched off or otherwise disabled. A drive signal is supplied to the load by the driver circuitry 110. Signals (e.g. voltages) IMON, VMON indicative of the current through the load 120 and the voltage across the load 120 arising due to the drive signal are output by the current monitor amplifier 150 and the voltage monitor amplifier 160 respectively. The IMON and VMON signals are digitised by the ADC circuitry 152, 162, and the digitised signals are processed by the processing circuitry 195 to calculate, estimate or otherwise determine the complex impedance of the load 120, as described above in relation to the circuitry 100 of FIG. 1.

When a mode control signal indicating a request for operation of the circuitry 200 in the load sensing mode is received by the control circuitry 230 from a requesting entity (e.g. an applications processor of a host device incorporating the circuitry 200), the control circuitry 230 causes the circuitry 200 to stop operating in the driving or playback mode, e.g. by switching off the drive signal. The processing circuitry 195 then compares an indication of the current through the load 120 to a predefined threshold. A result of this comparison may be provided to the control circuitry 230. If the indication of the load current meets (i.e. is equal to or greater than) the threshold, the control circuitry 230 prevents or delays operation of the circuitry 200 in the load sensing mode.

In some examples, the processing circuitry 195 is configured to compare an indication of the current through the load 120 at a point in time before operation of the circuitry 200 in the driving or playback mode stopped to the predefined threshold.

For example, the control circuitry 230 may be operative to transmit a control signal to the processing circuitry 195 on receiving the mode control signal indicating a request for operation of the circuitry 200 in the load sensing mode, to cause the processing circuitry 195 to sample the IMON signal and to compare this sample of the IMON signal to the predefined threshold.

In this way the load current at the time at which (or shortly before) operation of the circuitry 200 in the driving or playback mode is stopped can be determined or estimated. In this example, the predefined threshold may be indicative of a load current below which any residual current in the load 120 after the drive signal has stopped will have decayed to a level at which it will not give rise to components in the ISNS signal (generated during operation of the circuitry 200 in its load sensing mode) that will cause unacceptable inaccuracy in the calculation or estimation of the impedance of the load 120 based on the ISNS signal.

Thus, if the indication of the load current meets the predefined threshold, this may be indicative that the residual current in the load 120 will give rise to unacceptable inaccuracy in the calculation or estimation of the impedance of the load 120 if the circuitry 200 were to switch to its load sensing mode and perform a load sensing operation immediately.

In some examples, if the indication of the load current meets the predefined current, the control circuitry 230 may prevent operation of the circuitry 200 in its load sensing mode, and may output a signal to the requesting entity indicating that the load sensing mode is unavailable.

In other examples, if the indication of the load current meets the predefined threshold, the control circuitry 230 may delay changing the mode of operation of the circuitry 200 to the load sensing mode for a predefined delay period. The predefined delay period may be a static value (e.g. 1 ms) selected to ensure that any residual current in the load 120 will have decayed to a level that will not give rise to unacceptable inaccuracy in the calculation or estimation of the impedance of the load 120 when the circuitry 200 operates in its load sensing mode, regardless of the impedance of the load 120. Alternatively, the predefined delay period may be calculated or selected based on an impedance of the particular load 120 (e.g. a nominal load impedance or a previously measured load impedance) to ensure that any residual current in the load will have decayed to a level that will not give rise to unacceptable inaccuracy in the calculation or estimation of the impedance of the load 120 when the circuitry 200 operates in its load sensing mode. Once the predefined delay period has elapsed, the control circuitry 230 may cause the circuitry 200 to operate in its load sensing mode to calculate, estimate or otherwise determine the impedance of the load 120, and the impedance so determined may be reported to the requesting entity by the control circuitry 230.

In another example, on receiving the mode control signal indicating a request for operation of the circuitry 200 in the load sensing mode, the control circuitry 230 may cause the drive signal to be switched off, but may cause the current monitor amplifier 150 and the associated ADC 152 to continue to operate. In this way the processing circuitry 195 can continuously or periodically compare the IMON signal indicative of the current through the load 120 to the predefined threshold.

While a magnitude of the signal indicative of the current through the load 120 is greater than or equal to the predefined threshold, the control circuitry 230 prevents operation of the circuitry 200 in its load sensing mode. When the signal indicative of the current through the load falls below the predefined threshold, the control circuitry 230 causes the circuitry 200 to begin operating in its load sensing mode to calculate, estimate or otherwise determine the impedance of the load 120, and the impedance so determined may be reported to the requesting entity by the control circuitry 230.

Thus, in this example the control circuitry 230 delays operation of the circuitry 200 in its load sensing mode until any residual load current has decayed to a level that will not give rise to unacceptable inaccuracy in the calculation or estimation of the impedance of the load 120 when the circuitry 200 operates in its load sensing mode.

In further examples, on receiving the mode control signal indicating a request for operation of the circuitry 200 in the load sensing mode, the control circuitry 230 may cause the drive signal to be switched off, but maintain operation of the current monitor amplifier 150 and the associated ADC 152, and initiate some action or apply some stimulus to the circuitry 200 actively to reduce the current through the load 120. Once the load current has fallen below the predefined threshold, the control circuitry 230 may cause the circuitry 200 to commence operation in its load sensing mode. In these examples the load current decays more quickly than would otherwise be possible, thereby reducing a delay between operation of the circuitry 200 in its driving or playback mode stopping and commencing operation of the circuitry 200 in its load sensing mode.

In one example of an action or stimulus that may be applied to the circuitry 200, the control circuitry 230 outputs a first control signal to cause the first discharge switch 214, thereby enabling the first load discharge path 210, to provide a first path to ground for residual load current. If the second load discharge path 212 is provided, the control circuitry 230 may also output a second control signal to cause the second discharge switch 224 to close, thereby enabling the second load discharge path 220, to provide a second path to ground for residual load current through.

While the first and, optionally, second load discharge paths 210, 220 are enabled, the processing circuitry 195 compares the IMON signal indicative of the current through the load 120 to a predefined threshold. While a magnitude of the signal indicative of the current through the load 120 is greater than or equal to the predefined threshold, the control circuitry 230 prevents operation of the circuitry 200 in its load sensing mode. When the signal indicative of the current through the load falls below the predefined threshold, the control circuitry 230 outputs control signal(s) to cause the first and (if provided) second discharge path switches 214, 224 to open, thereby disabling the first and second load discharge paths 210, 220. The control circuitry 230 then causes the circuitry 200 to begin operating in its load sensing mode to calculate, estimate or otherwise determine the impedance of the load 120, and the impedance so determined may be reported to the requesting entity by the control circuitry 230.

In another example of an action or stimulus that may be applied to the circuitry 200, which may be implemented instead of or in addition to the example described above, the control circuitry 230 outputs a control signal to a control terminal of the return path switch 142 to control a resistance or impedance of the return path switch 142, thereby providing a path to ground for residual load current.

The control signal may cause the return path switch 142 to turn fully on, thereby providing a low resistance path to ground for residual load current.

Alternatively, the control signal may set the resistance or impedance of the return path switch 142 (e.g. a drain to source resistance, if the return path switch 142 is an N channel MOSFET device) to a given value, thereby providing a resistive path to ground for residual load current. This may be advantageous, because the rate of decay of the residual load current when the load 120 is coupled to a resistive path to ground is proportional to L/R, where L is the inductance of the load 120 and R is the resistance of the path. Thus, the resistance or impedance of the return path switch 142 may be determined according to the inductance of the load 120 (e.g. a nominal inductance or a previously measured inductance of the load 120) to achieve a desired rate or time constant for decay of the residual load current.

As a further alternative, the control signal may cause the resistance or impedance of the return path switch 142 to vary over time, e.g. increasing in a series of steps or in a ramped fashion from an initial resistance or impedance value to a higher resistance or impedance. This approach may permit a greater degree of control over the rate of decay of the residual load current.

The resistance or impedance of the return path switch 142 may be set in a variety of different ways. For example, if the return path switch 142 is an N channel FET device, the control signal may be a voltage supplied to the gate of the return path switch 142 by the control circuitry 230, with the magnitude of the supplied voltage determining the drain-source resistance of the return path switch 142. Alternatively, if the return path switch 142 is a multi-finger FET device, its resistance or impedance may be controlled by driving different fingers of the device with suitable control signals. Other methods of controlling the resistance or impedance of the return path switch 142 will be apparent to those of ordinary skill in the art.

In another example of an action or stimulus that may be applied to the circuitry 200, which may be implemented instead of or in addition to one or more of the examples described above, a low impedance voltage source may be used to supply a voltage to the second load terminal 124, to minimise or reduce any residual load current when the drive signal has been removed. The common mode buffer circuitry 170 may be used as the low impedance voltage source, in which case the return path switch 142 is switched off and the common mode buffer circuitry 170 is activated by the control circuitry 230 on receiving the mode control signal indicating a request for operation of the circuitry 200 in the load sensing mode.

Figure 3:
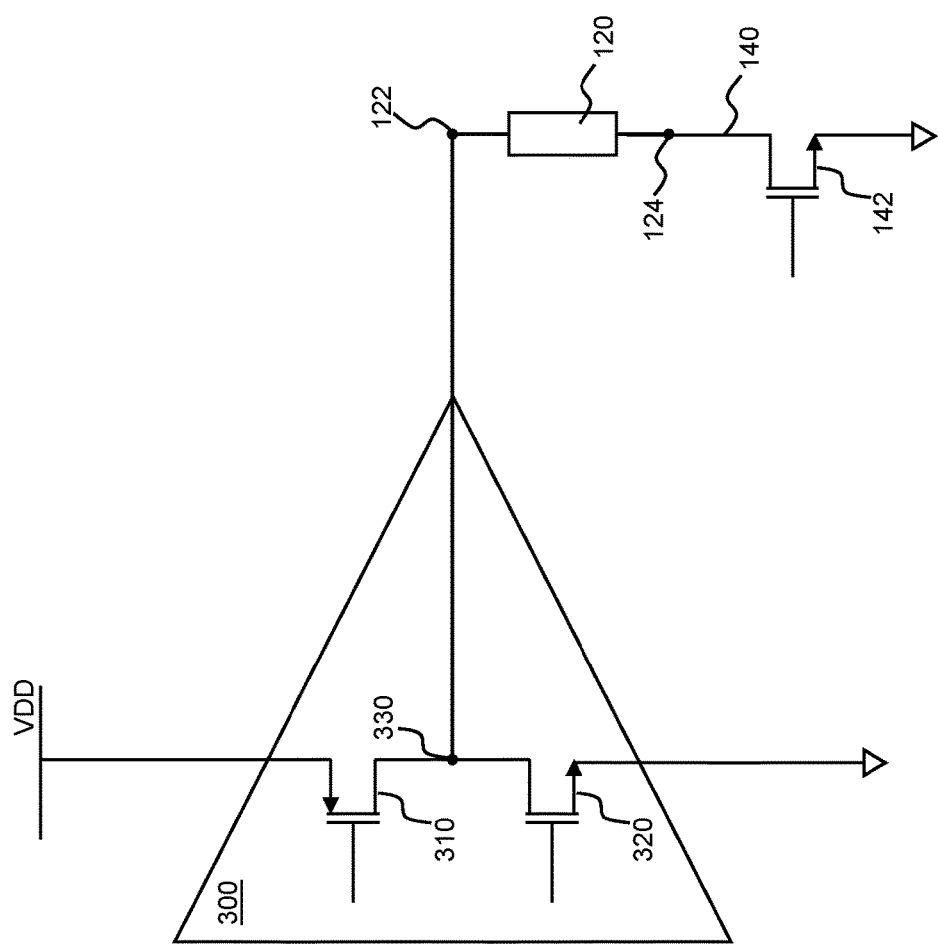
FIG. 3 is a schematic diagram showing a half-bridge output stage in Class D amplifier circuitry that may be used to implement driver circuitry in the circuitry of FIG. 2.

FIG. 3 is a schematic diagram showing Class D amplifier circuitry that may be used to implement the driver circuitry 110 of the circuitry 200 of FIG. 2.

The Class D amplifier circuitry, shown generally at 300 in FIG. 3, includes a half-bridge output stage comprising a high-side switch 310 (e.g. a P-channel MOSFET device) and a low-side switch 320 (e.g. an N-channel MOSFET device). In this example a source terminal of the high-side switch 310 is coupled to a supply voltage rail of the circuitry 200 and a drain terminal of the high-side switch 310 is coupled to a drain terminal of the low-side switch 320. A source terminal of the low-side switch 320 is coupled to ground (or some other reference voltage). Input signals to the half-bridge output stage are received at the gate terminals of the high-side switch and the low-side switch in a manner that will be familiar to those of ordinary skill in the art. A node 330 coupled to the drain terminals of the high-side switch 310 and the low-side switch acts as an output node of the Class D amplifier circuitry 300, and is coupled to the first load terminal 122 of the circuitry 200.

In yet another example of an action or stimulus that may be applied to the circuitry 200, which may be implemented instead of or in addition to one or more of the examples described above, the control circuitry 230 outputs a control signal to one of the switches 310, 320 of the Class D amplifier circuitry 300 such that the switches 310, 320 may be used to provide a discharge path for residual load current.

Thus, the control circuitry 230 may output a control signal to a control terminal of the low-side switch 320 (e.g. a gate terminal, where the low-side switch is a MOSFET device) to control a resistance or impedance of the low-side switch 320, thereby providing a path to ground for residual load current. The control signal may cause the low-side switch 320 to turn fully on, thereby providing a low impedance path to ground for residual load current, or alternatively the control signal may set the resistance or impedance of the low-side switch 320 to a desired value, or may cause the resistance or impedance of the low-side switch 320 to change over time (e.g. increasing in a series of steps or in a ramped manner) as described above in relation to controlling the resistance or impedance of the return path switch 142.

Alternatively, the control circuitry 230 may output a control signal to a control signal of the high-side switch 310 (e.g. a gate terminal, where the high-side switch is a MOSFET device) to switch the high-side switch on, thereby providing a path to the supply voltage rail for residual load current.

As will be appreciated, by taking action or applying a stimulus to the circuitry 200 as described above, the control circuitry 230 can actively control the time taken for the residual load current to decay to a level that will not give rise to components in the ISNS signal that will cause unacceptable inaccuracy in the calculation or estimation of the impedance of the load 120 when the circuitry 200 operates in its load sensing mode.

Thus the circuitry of the present disclosure provides a way of improving the accuracy of a calculated or estimated load impedance, and in some examples reduces the time delay required between operation in a playback or driving mode of operation stopping and commencing operation in a load sensing mode.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving a load, the circuitry comprising:
   driver circuitry; and
   load sensing circuitry,
   wherein the circuitry is operable in:
   a driving mode of operation in which the driver circuitry supplies a drive signal to a load coupled to the circuitry; and
   a load sensing mode of operation, for estimating a characteristic of the load coupled to the circuitry based on a signal output by the load sensing circuitry in response to a stimulus signal,
   wherein the circuitry is configured to, in response to a request for operation of the circuitry in the load sensing mode:
   compare an indication of a current through the load to a predefined threshold; and if the indication of the current through the load meets the predefined threshold, prevent or delay operation in the load sensing mode.

2. The circuitry according to claim 1, wherein the circuitry is configured to commence operation in the load sensing mode when the indication of the current through the load falls below the predefined threshold.

3. The circuitry according to claim 1, wherein the circuitry further comprises control circuitry operable to apply a stimulus to the circuitry to reduce the current through the load if the indication of the current through the load meets the predefined threshold.

4. The circuitry according to claim 3, wherein the circuitry further comprises:
 a first load terminal coupled to an output of the driver circuitry; and
 a second load terminal coupled to a return path,
 wherein in use of the circuitry the load is coupled between the first load terminal and the second load terminal,
 wherein the return path comprises a return path switch for coupling the second load terminal to a reference voltage supply,
 and wherein the stimulus comprises a control signal supplied to a control terminal of the return path switch to control an impedance of the return path switch.

5. The circuitry according to claim 4 wherein the control signal is for:
 setting the return path switch to a low impedance state;
 setting an impedance of the return path switch to a particular value; or
 adjusting the impedance of the return path switch over time.

6. The circuitry according to claim 3, wherein the circuitry further comprises a load discharge path comprising a load discharge switch for selectively coupling the load to ground, and wherein the stimulus comprises a control signal supplied to a control terminal of the load discharge switch.

7. The circuitry according to claim 6, wherein the load discharge path further comprises a resistor in series with the load discharge switch.

8. The circuitry according to claim 3, wherein the driver circuitry comprises a half-bridge output stage for supplying the drive signal to the load, wherein the stimulus comprises a control signal supplied to a control terminal of a low-side switch of the half-bridge output stage to control an impedance of the low-side switch.

9. The circuitry according to claim 8 wherein the control signal is for:
 setting the low-side switch to a low impedance state;
 setting an impedance of the low-side switch to a particular value; or
 adjusting the impedance of the low-side switch over time.

10. The circuitry according to claim 8, wherein the driver circuitry comprises a half-bridge output stage for supplying the drive signal to the load, wherein the stimulus comprises a control signal supplied to a control terminal of a high-side switch of the half-bridge output stage to switch the high-side switch on.

11. The circuitry according to claim 10, wherein the driver circuitry comprises Class D amplifier circuitry.

12. The circuitry according to claim 1, wherein the circuitry is operable to apply a stimulus to the circuitry to reduce the current through the load if the indication of the current through the load meets the predefined threshold, wherein the stimulus comprises a voltage supplied to the load by a low-impedance voltage source.

13. The circuitry according to claim 1, wherein the circuitry comprises current monitoring circuitry operable to monitor a current through the load in operation of the circuitry in the driving mode, and wherein the indication of a current through the load comprises an output of the current monitoring circuitry.

14. The circuitry according to claim 13, wherein the indication of the current through the load comprises a sample of a signal output by the current monitoring circuitry, the sample taken in response to the request for operation of the circuitry in the load sensing mode.

15. The circuitry according to claim 1, wherein the driver circuitry is configured to supply the stimulus signal in operation of the circuitry in the load sensing mode.

16. The circuitry according to claim 1, further comprising load sense driver circuitry, different from the driver circuitry, configured to supply the stimulus signal in operation of the circuitry in the load sensing mode.

17. An integrated circuit comprising the circuitry according to claim 1.

18. A host device comprising the circuitry according to claim 1.

19. The host device according to claim 18, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

* * * * *